(12) United States Patent
Filoteo, Jr. et al.

(10) Patent No.: US 7,619,314 B2
(45) Date of Patent: Nov. 17, 2009

(54) INTEGRATED CIRCUIT PACKAGE SYSTEM INCLUDING DIE STACKING

(75) Inventors: Dario S. Filoteo, Jr., Singapore (SG); Tsz Yin Ho, Tuen Mun (HK)

(73) Assignee: Stats Chippac Ltd., Singapore (SG)

( * ) Notice: Subject to any disclaimer, the term of this patent is extended or adjusted under 35 U.S.C. 154(b) by 44 days.

(21) Appl. No.: 11/869,738

(22) Filed: Oct. 9, 2007

(65) Prior Publication Data

US 2008/0029862 A1    Feb. 7, 2008

Related U.S. Application Data (63) Continuation of application No. 11/307,861, filed on Feb. 25, 2006, now Pat. No. 7,298,038.

(51) Int. Cl.
*H01L 23/02* (2006.01)
*H01L 23/29* (2006.01)

(52) U.S. Cl. .......... 257/777; 257/790; 257/666; 257/685; 257/686; 257/E25.005; 257/E25.006; 257/E25.021; 257/E25.027; 257/E23.085

(58) Field of Classification Search .......... 257/685, 257/686, 723, 777, E25.005, E25.006, E25.021, 257/E25.027, E23.085, 666–667, 790; 438/109, 438/FOR. 368, FOR. 426
See application file for complete search history.

(56) References Cited

U.S. PATENT DOCUMENTS

| | | | |
|---|---|---|---|
| 5,942,794 A * | 8/1999 | Okumura et al. | 257/666 |
| 6,080,264 A | 6/2000 | Ball | |
| 6,087,722 A | 7/2000 | Lee et al. | |
| 6,104,084 A | 8/2000 | Ishio et al. | |
| 6,201,302 B1 * | 3/2001 | Tzu | 257/724 |
| 6,376,914 B2 | 4/2002 | Kovats et al. | |
| 6,603,072 B1 | 8/2003 | Foster et al. | |
| 6,781,243 B1 | 8/2004 | Li et al. | |
| 6,838,754 B2 | 1/2005 | Kim | |
| 6,861,288 B2 | 3/2005 | Shim et al. | |
| 6,879,031 B2 | 4/2005 | Wang | |
| 2005/0046003 A1 | 3/2005 | Tsai | |
| 2007/0018290 A1 | 1/2007 | Punzalan et al. | |

* cited by examiner

*Primary Examiner*—Jasmine J Clark
(74) *Attorney, Agent, or Firm*—Mikio Ishimaru (57) ABSTRACT

An integrated circuit package system includes providing a leadframe, forming an aperture within the leadframe, mounting an integrated circuit package over or under the aperture, and mounting a die over the integrated circuit package with the die located within the aperture.

8 Claims, 6 Drawing Sheets

INTEGRATED CIRCUIT PACKAGE SYSTEM INCLUDING DIE STACKING

CROSS-REFERENCE TO RELATED APPLICATION(S)

This application is a continuation of U.S. Non Provisional Patent Application Ser. No. 11/307,861 filed Feb. 25, 2006, now U.S. Patent No. 7,298,038 B2.

TECHNICAL FIELD

The present invention relates generally to integrated circuit packaging, and more particularly to an integrated circuit package system including die stacking.

BACKGROUND ART

Integrated circuits are what power many of today's consumer electronics, for instance, cellphones, video cameras, portable music players, computers, etc. Integrated circuits are employed in a multitude of environments, and consequently their packaging must protect them from various environmental conditions of contamination, such as, moisture, temperature, mechanical vibration, and even physical abuse.

As customer demand improves integrated circuit (IC) performance, faster, more reliable, and higher-density circuits, need to be produced. Various techniques, such as, flip chip, gall grid array (BGA), chip on board (COB), and multi-chip modules (MCM), have been developed to meet the continued demands for improving system performance and hardware capabilities, while the space in which to provide these improved hardware capabilities continues to decrease.

MCM may include two or more chips stacked one on top of another (i.e.—vertically stacked). This mounting technique permits a higher density of chips or integrated circuits on the MCM substrate. The substrate may include one or more layers of electrically conductive material separated by dielectric materials.

Although vertically stacked MCM's may increase the effective density of chips, over that of horizontally placed MCM components, it has the disadvantage in that the MCM's must usually be assembled before the component chips and chip connections can be tested. These extra manufacturing steps can lead to increased cost and decreased product yield if the chips are defective.

Another common problem associated with vertically stacked MCM's is that the bottom chip must be larger than the top chip to accommodate the plurality of bond pads located on the bottom chip. Due to the constraint of limited space available for mounting individual chips on a substrate, the larger configuration of the bottom chip decreases the number of chips per semiconductor wafer, and correspondingly, increases the cost of manufacturing.

Another problem of vertically stacked MCM's is the lack of sufficient electrical interconnections and signal routing possibilities between the chips themselves, and between the chips and the input/output terminals of the package. Consequently vertically stacked MCM's in a leadframe package format have typically been limited to a simple fan-out interconnection of the chips to the leads, with very limited chip-to-chip interconnection and signal routing capability.

Thus, despite recent developments in semiconductor packaging techniques, a need still remains for improved packaging methods of fabrication to increase semiconductor chip densities while efficiently using wafer space. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including a leadframe with an aperture formed therein. An integrated circuit package is mounted to the leadframe over or under the aperture and a die is mounted within the aperture to the integrated circuit package.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown exaggerated in the drawing FIGS. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

What follows is a brief description of a generalized process flow overview for the manufacturing of an integrated circuit package system including a stacked die.

The process flow begins with loading a leadframe into an apparatus for processing. The apparatus manipulates the leadframe by forming an aperture in a portion of the leadframe. A package is then mounted to the leadframe. The package may be a known good die package and may be mounted to cover the exposed aperture. The package is then adhered to the leadframe by a reflow process.

After adhering the package to the leadframe, an epoxy is dispensed on an exposed portion of the package. The exposed portion of the package may occur within the aperture and may include a substrate. A die is then attached to the epoxy on the package. The epoxy securing the die is then cured.

After securing the die to the package, the die is interconnected to the leadframe by wire bonding. The leadframe, the package, the die and the wire bonds are then encapsulated by a molding compound, thereby increasing the durability and improving the reliability of the device operation. After encapsulation, a post-mold-cure (PMC) is then performed. The structure thus formed is then trimmed and formed for its intended purpose.

The manufacturing process for fabricating an integrated circuit package system including a stacked die can be further described by FIGS. 1-8, which depict an exemplary manufacturing sequence for a generalized package assembly flow for the production of an integrated circuit package system 100. As will be described further hereinbelow, the present invention provides for chip stacking on an integrated circuit package. The chip and the integrated circuit package may include active components, passive components, surface mount components, stacked components, and so forth, in numerous configurations and arrangements as may be needed.

Figure 1:
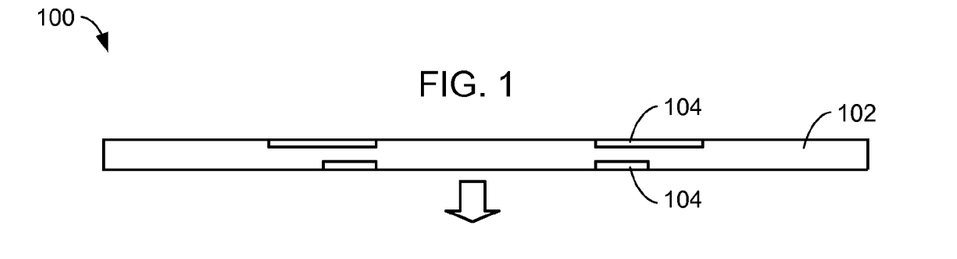
FIG. 1 is a sectional view of a leadframe of the integrated circuit package system in accordance with an embodiment of the present invention.

Referring now to FIG. 1, therein is shown a sectional view of a leadframe 102 of the integrated circuit package system 100 in accordance with an embodiment of the present invention. The leadframe 102 may be a dual row leadframe, for example, and includes electrical contacts 104 on the top and bottom. The electrical contacts 104 may be pre-plated with, but not limited to, an alloy of nickel (Ni) and palladium (Pd). The outer leads of the leadframe 102 may be pre-plated with, but not limited to, an alloy of lead (Pb), tin (Sn), gold (Ag) and copper (Cu). The outer leads are typically formed integrally with the inner leads and extend from the package body for establishing an external electrical connection. The leadframe 102 can be made from a conducting material such as copper.

Figure 2:
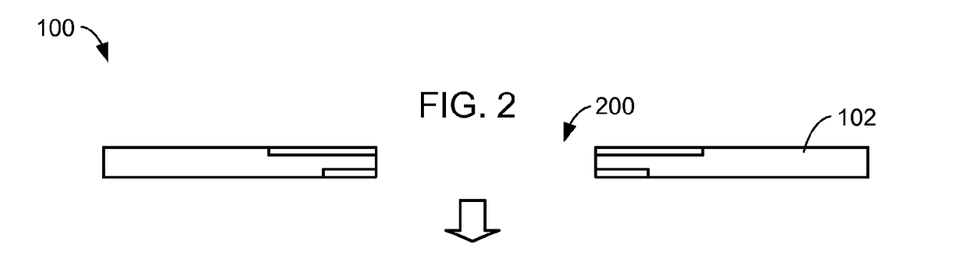
FIG. 2 is the structure of FIG. 1 after aperture formation.

Referring now to FIG. 2, therein is shown the structure of FIG. 1 after aperture formation. FIG. 2 depicts the formation of an aperture 200 within a central portion of the leadframe 102. By way of example, the aperture 200 may be formed by punching, milling or chemical etching.

The aperture 200 is formed such that subsequently mounted or stacked integrated circuit components, such as an integrated circuit package 300 (not shown) or a die 500 (not shown), may pass through the aperture 200. By allowing the subsequently mounted or stacked integrated circuit components to pass through the aperture 200, the overall dimensions of the integrated circuit package system 100 may be reduced by utilizing the thickness of the leadframe 102.

Figure 3:
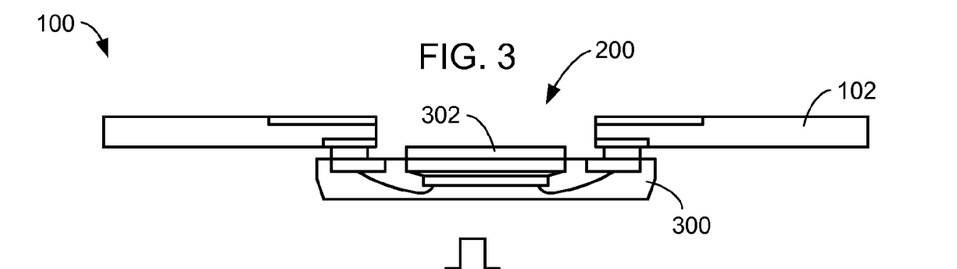
FIG. 3 is the structure of FIG. 2 after integrated circuit package attachment.

Referring now to FIG. 3, therein is shown the structure of FIG. 2 after integrated circuit package attachment. FIG. 3 depicts the attachment of an integrated circuit package 300, such as a known good package, to the leadframe 102. For example, the integrated circuit package 300 may be electrically connected to the leadframe 102 by a solder paste and reflow method. The integrated circuit package 300 may include, by way of example and not by way of limitation, quad-flat non-leaded packages, wire bond packages, dual-side memory packages, internal stacking module packages, flip-chip packages, or stacked die packages incorporating a mix of various devices such as flip chips and wire bondable chips. In accordance with the invention, the integrated circuit package 300 may further include various modular packages or application-specific-integrated-circuit (ASIC) packages of various sizes and dimensions that are well known within the art.

It is to be understood that the integrated circuit package 300 of the present invention covers a wide range of package configurations and the type of package configuration employed is only limited by the ability to secure the package to the leadframe 102. Consequently, the invention includes any package configuration that may be adhered to the leadframe 102. Furthermore, in accordance with the scope of this invention, it is to be understood that the integrated circuit package 300 may include multiple integrated circuits or additional packages stacked thereover.

Notably, the integrated circuit package 300 may also be individually tested in advance of assembly into the integrated circuit package system 100 to assure that the integrated circuit package 300 is properly formed and contains good die. The integrated circuit package 300 is thus proven as a known good package, and thereby improves the assembly process yield performance.

Additionally, the integrated circuit package 300 may include a substrate 302, such as an interposer, a bonding pad, or a paddle, formed within the aperture 200.

Furthermore, although FIG. 3 depicts the integrated circuit package 300 mounted below the leadframe 102, it is to be understood that this invention includes mounting the integrated circuit package 300 to the leadframe 102 over or under the aperture 200.

Figure 4:
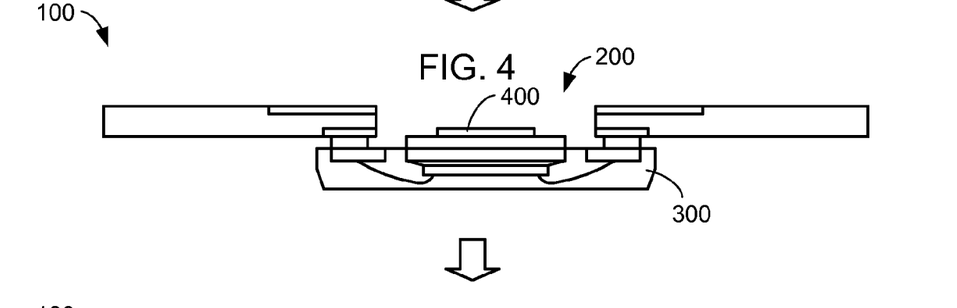
FIG. 4 is the structure of FIG. 3 after adhesive deposition.

Referring now to FIG. 4, therein is shown the structure of FIG. 3 after adhesive deposition. During this process step a quantity of an adhesive composition 400 is applied to the integrated circuit package 300 that is exposed within the aperture 200. For example, the adhesive composition 400 may be an epoxy resin or an adhesive film. The quantity of the adhesive composition 400 deposited may be any quantity sufficient to adequately secure a die to the integrated circuit package 300. As exemplary illustrations, the adhesive composition 400 may form a fillet or a zero fillet structure.

Figure 5:
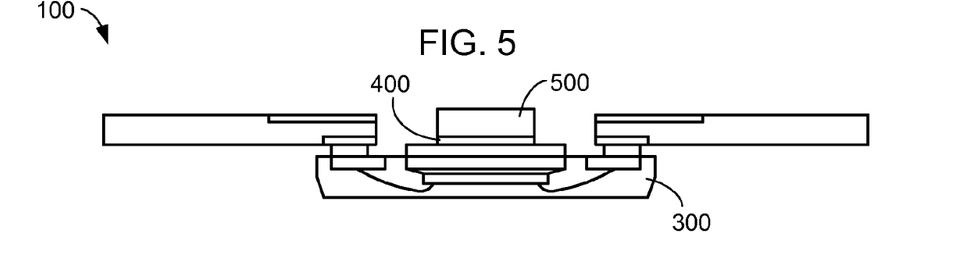
FIG. 5 is the structure of FIG. 4 after die attachment.

Referring now to FIG. 5, therein is shown the structure of FIG. 4 after die attachment. FIG. 5 illustrates the placement of a die 500, such as a known good die, over the adhesive composition 400 within the aperture 200. The die 500 may include, by way of example and not by way of limitation, a wire bond die, a flip-chip die, a stacked die, or any combination thereof. In accordance with the invention, the die 500 may further include various modular dies or ASIC dies of various sizes and dimensions that are well known within the art.

It is to be understood that the die 500 of the present invention covers a wide range of configurations and types, and the configuration or type employed is only limited by the ability to secure the die 500 to the integrated circuit package 300. Consequently, the invention includes any die configuration or type that may be adhered to the integrated circuit package 300. Furthermore, in accordance with the scope of this invention, it is to be understood that the die 500 may include additional die stacked thereover.

Additionally, the present invention allows for testing of the die 500 before incorporation into the integrated circuit package system 100, therefore ensuring the use of known good die in the manufacturing process.

Figure 6:
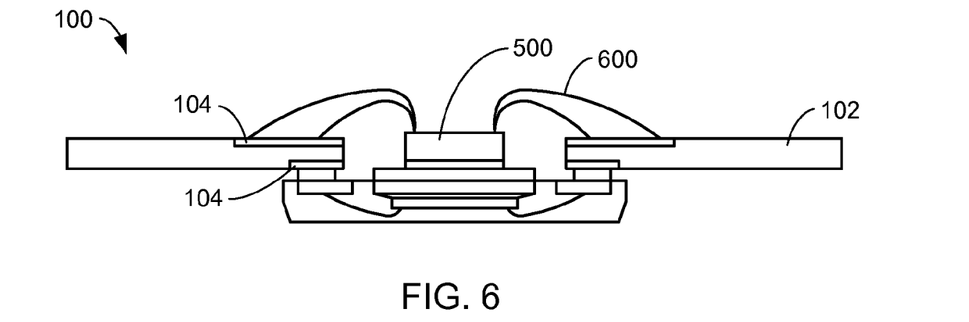
FIG. 6 is the structure of FIG. 5 after interconnect formation.

Referring now to FIG. 6, therein is shown the structure of FIG. 5 after interconnect formation. Wire bonds 600 are used to interconnect the die 500 to the electrical contacts 104 of the leadframe 102 using materials and techniques well known in the art.

Figure 7:
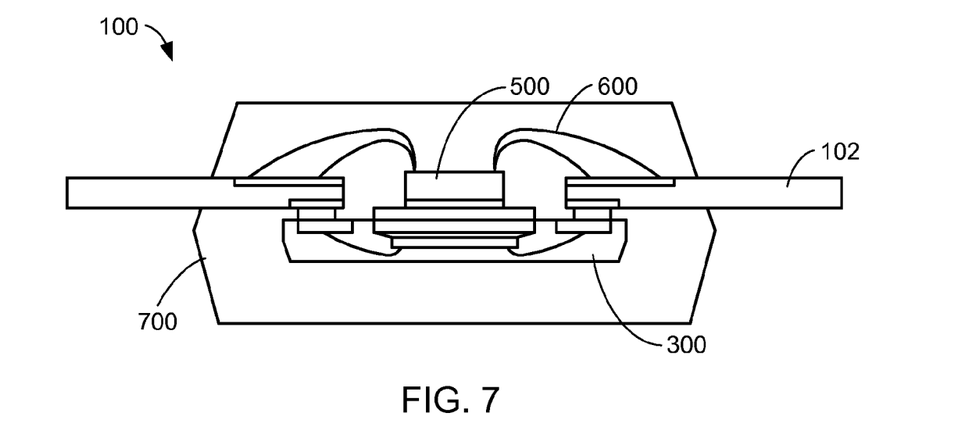
FIG. 7 is the structure of FIG. 6 after molding and post-mold-cure.

Referring now to FIG. 7, therein is shown the structure of FIG. 6 after molding and post-mold-cure. The leadframe 102, the integrated circuit package 300, the die 500 and the wire bonds 600 are then preferably encapsulated in a molding compound 700 to protect the integrated circuit package system 100 from the external environment. The molding compound 700 will typically be formed from a ceramic, an epoxy, a thermosetting resin compound, or other suitable polymeric composition. After encapsulation, the integrated circuit package system 100 is then subjected to a PMC process.

Figure 8:
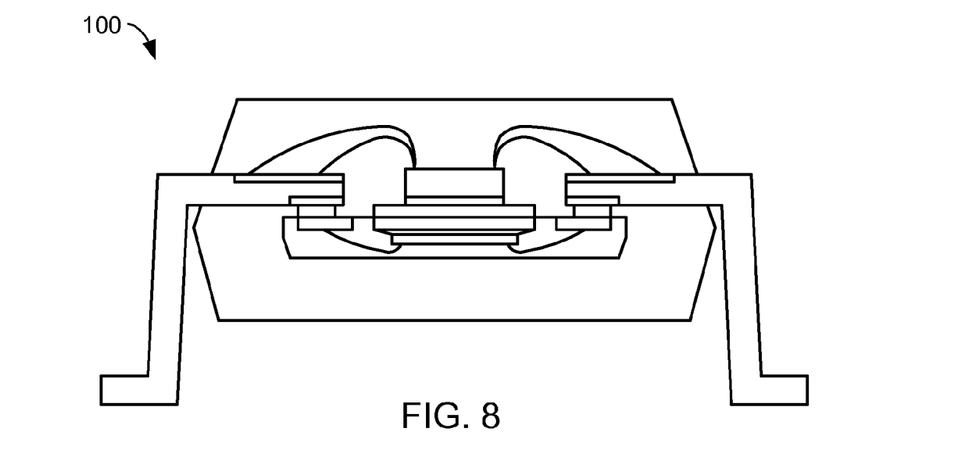
FIG. 8 is the structure of FIG. 7 after trim and lead formation.

Referring now to FIG. 8, therein is shown the structure of FIG. 7 after trim and lead formation. Once encapsulated, the integrated circuit package system 100 goes through conventional trim and lead formation. For example, the encapsulated package may be placed into a lead trim-and-form tool where the leads are formed into necessary shapes such as gull wing, J-lead and straight.

Although examples are given above, it is to be understood that the leads may be sized, bent and/or otherwise formed to provide package configurations having a wide range of mount designs and types. The lead configurations applicable to the present invention are only intended to be limited by the design specifications of the integrated circuit package system 100.

FIGS. 9-14 depict exemplary embodiments in accordance with aspects of the present invention; however, they are not to be construed as limiting.

Figure 9:
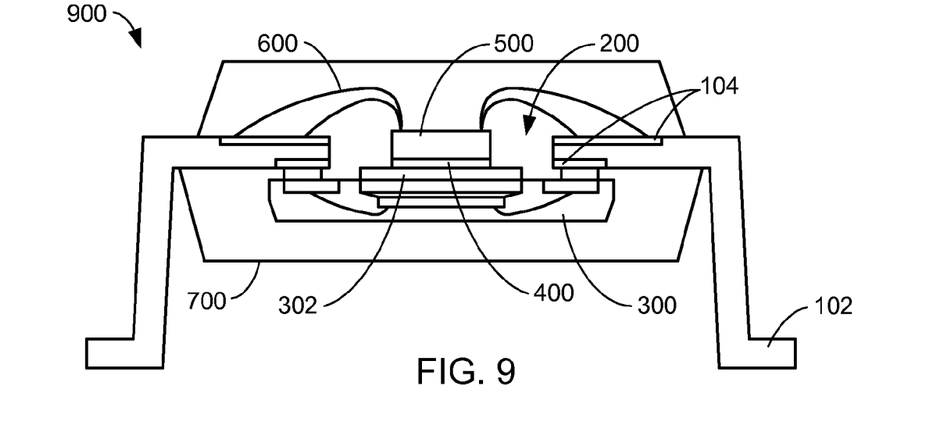
FIG. 9 is a sectional view of an integrated circuit package system in accordance with an embodiment of the present invention.

Referring now to FIG. 9, therein is shown a sectional view of an integrated circuit package system 900 in accordance with an embodiment of the present invention. The integrated circuit package system 900 includes the leadframe 102, the electrical contacts 104, the aperture 200, the integrated circuit package 300, the substrate 302, the adhesive composition 400, the die 500, the wire bonds 600 and the molding compound 700.

The integrated circuit package 300, such as a known good package, is adhered to the leadframe 102, such as a dual row lead designed leadframe, by a solder paste. Per this embodiment, the integrated circuit package 300 may include, for example, a quad flat non-leaded package or its equivalent, a wire bond package, a flip-chip package, or a stacked die package further including a mix of devices such as flip-chips and wire bondable chips. It is to be understood that the preceding examples are merely provided for illustrative purposes and that the type of the integrated circuit package 300 attached to the leadframe 102 is only limited by the packages ability to adhere to the leadframe 102. Furthermore, in accordance with the scope of this invention, it is to be understood that the integrated circuit package 300 may include additional packages stacked thereover.

The die 500, such as a known good die, is attached to the integrated circuit package 300 by the adhesive composition 400. The die 500 may include, for example, a wire bond die, a flip-chip die, a stacked die, or various other combinations, configurations and arrangements thereof, as may be needed. It is to be understood that the preceding examples are merely provided for illustrative purposes and that the type of the die 500 attached to the integrated circuit package 300 is only limited by the die 500 ability to adhere to the integrated circuit package 300. Furthermore, in accordance with the scope of this invention, it is to be understood that the die 500 may include additional die stacked thereover.

The integrated circuit package system 900 additionally depicts the wire bonds 600 attached to the electrical contacts 104, with the molding compound 700 encapsulating the system.

Figure 10:
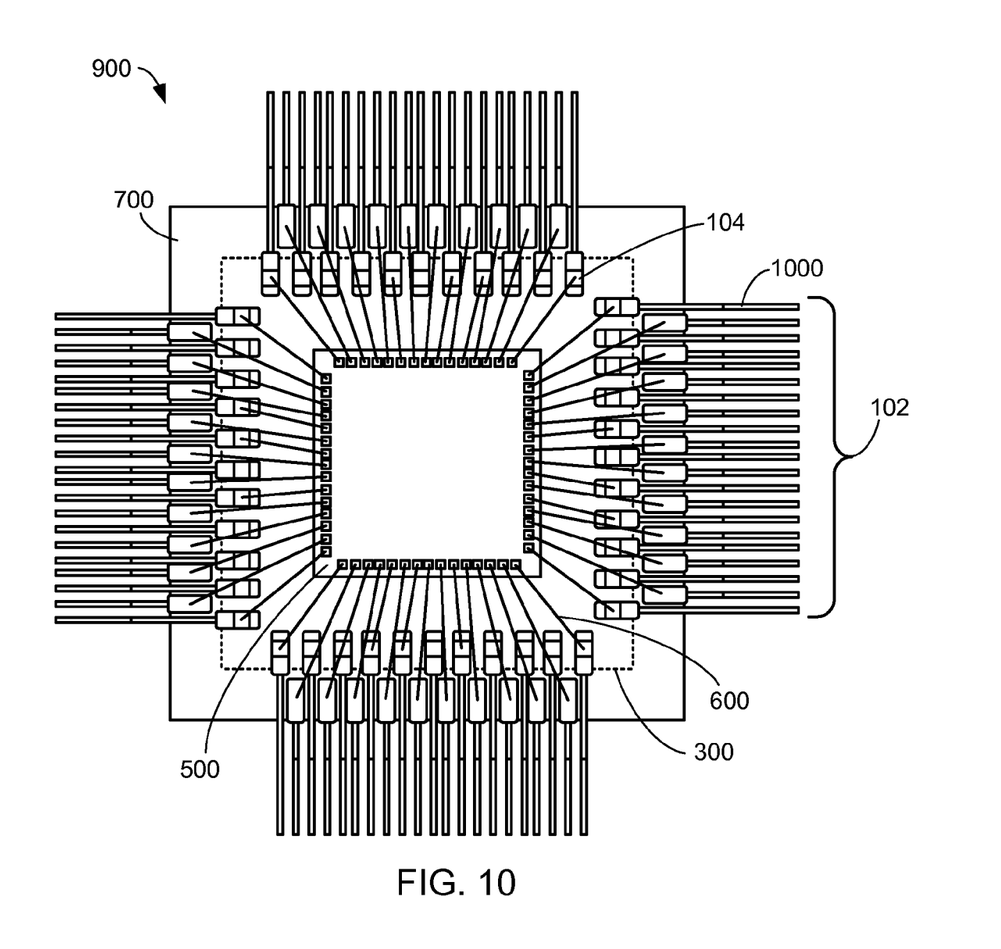
FIG. 10 is a top view of the integrated circuit package system of FIG. 9.

Referring now to FIG. 10, therein is shown a top view of the integrated circuit package system 900 of FIG. 9. The integrated circuit package system 900 includes the leadframe 102, the electrical contacts 104, the integrated circuit package 300, the die 500, the wire bonds 600 and the molding compound 700. Most notably, the leadframe 102 employs a staggered lead design to maximize the number of inputs/outputs per unit area. Per this embodiment, leads 1000 per side of the integrated circuit package system 900 are approximately equal.

Figure 11:
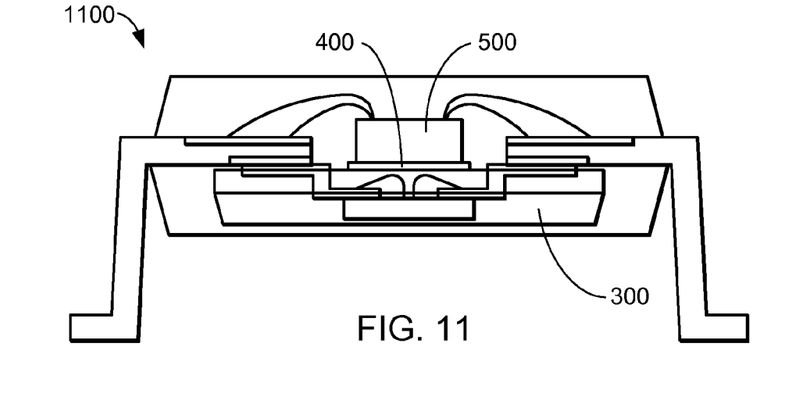
FIG. 11 is a sectional view of an integrated circuit package system in accordance with an embodiment of the present invention.
Figure 12:
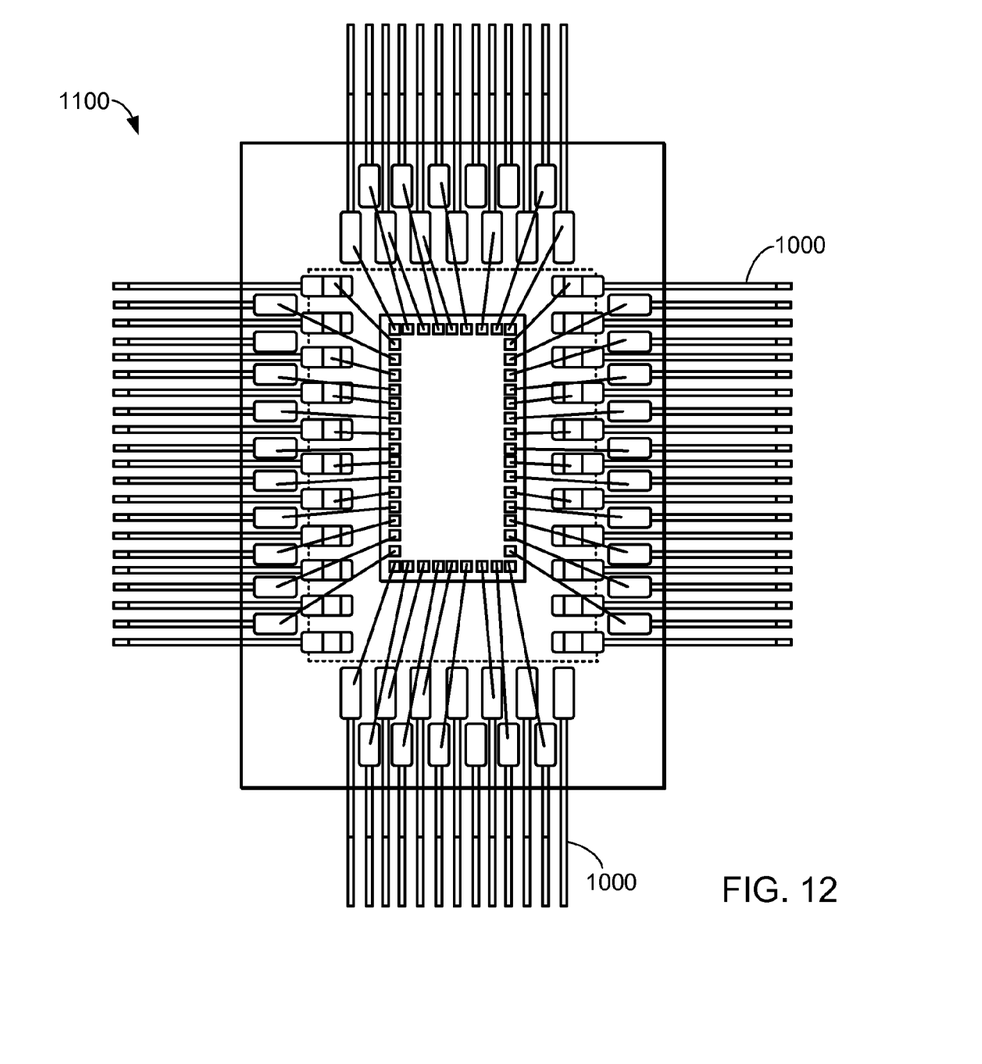
FIG. 12 is a top view of the integrated circuit package system of FIG. 11.

FIGS. 11 and 12 depict similar configurations as employed in FIGS. 9 and 10, therefore, only the differences between the figures will be described, to avoid redundancy.

Referring now to FIG. 11, therein is shown a sectional view of an integrated circuit package system 1100 in accordance with another embodiment of the present invention. Notably, the integrated circuit package 300 may additionally include a dual side memory package or its equivalent. The die 500 may be adhered to the integrated circuit package 300 by the adhesive composition 400.

Referring now to FIG. 12, therein is shown a top view of the integrated circuit package system 1100 of FIG. 11. Per this embodiment, the leads 1000 per opposing sides of the integrated circuit package system 1100 are approximately equal and the leads 1000 per adjacent sides are unequal.

Figure 13:
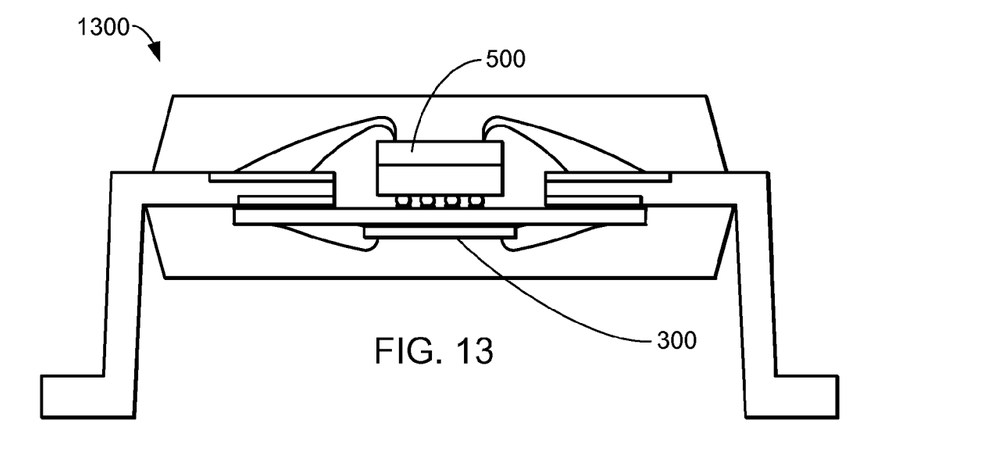
FIG. 13 is a sectional view of an integrated circuit package system in accordance with an embodiment of the present invention.
Figure 14:
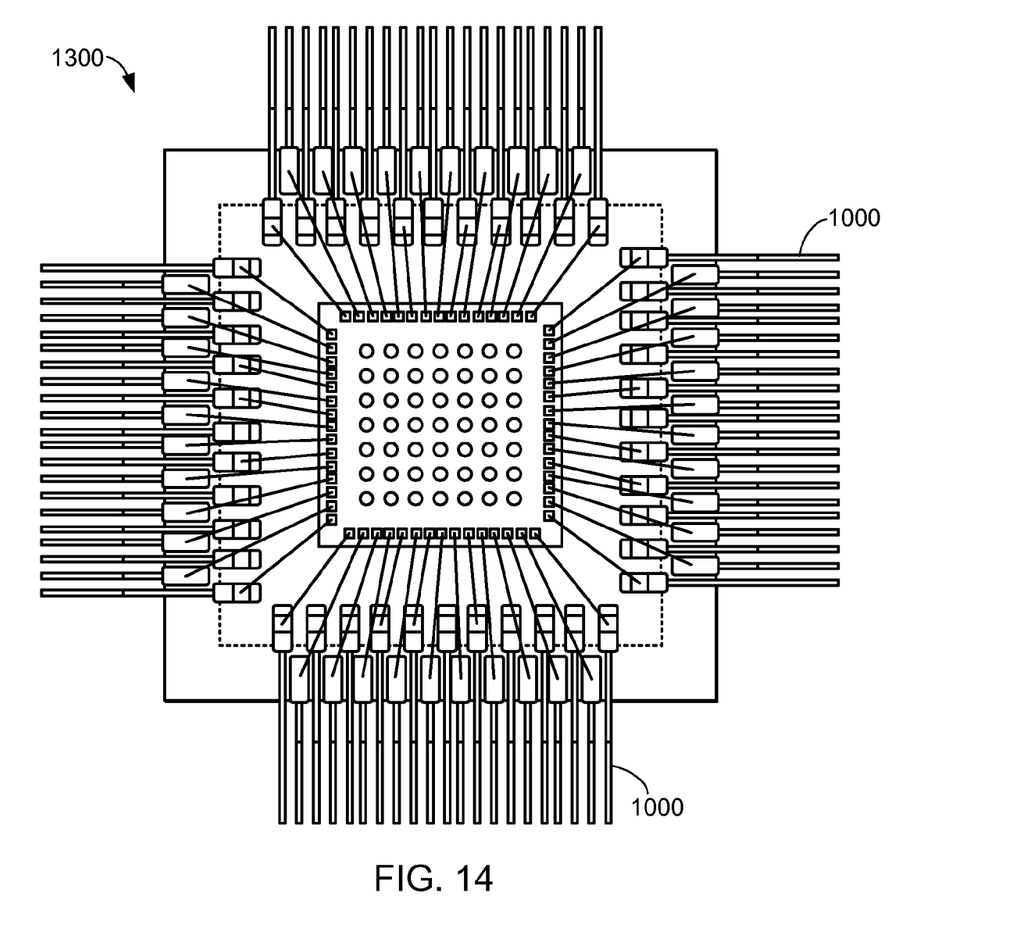
FIG. 14 is a top view of the integrated circuit package system of FIG. 13.

FIGS. 13 and 14 depict similar configurations as employed in FIGS. 9 and 10, therefore, only the differences between the figures will be described, to avoid redundancy.

Referring now to FIG. 13, therein is shown a sectional view of an integrated circuit package system 1300 in accordance with another embodiment of the present invention. Notably, the integrated circuit package 300 may additionally include an internal stacking module (ISM) package or its equivalent. The ISM may be incorporated into a package-in-package (PiP) structure. PiP is a three-dimensional package that stacks a fully tested ISM on top of a base assembly package (BAP) to form a single chip scale package (CSP) solution. Furthermore, the die 500 may be attached to the integrated circuit package 300 by surface mount technology well known in the art, such as ball grid array and fine ball grid array.

Referring now to FIG. 14, therein is shown a top view of the integrated circuit package system 1300 of FIG. 13. Per this embodiment, the leads 1000. per side of the integrated circuit package system 1300 are approximately equal.

Figure 15:
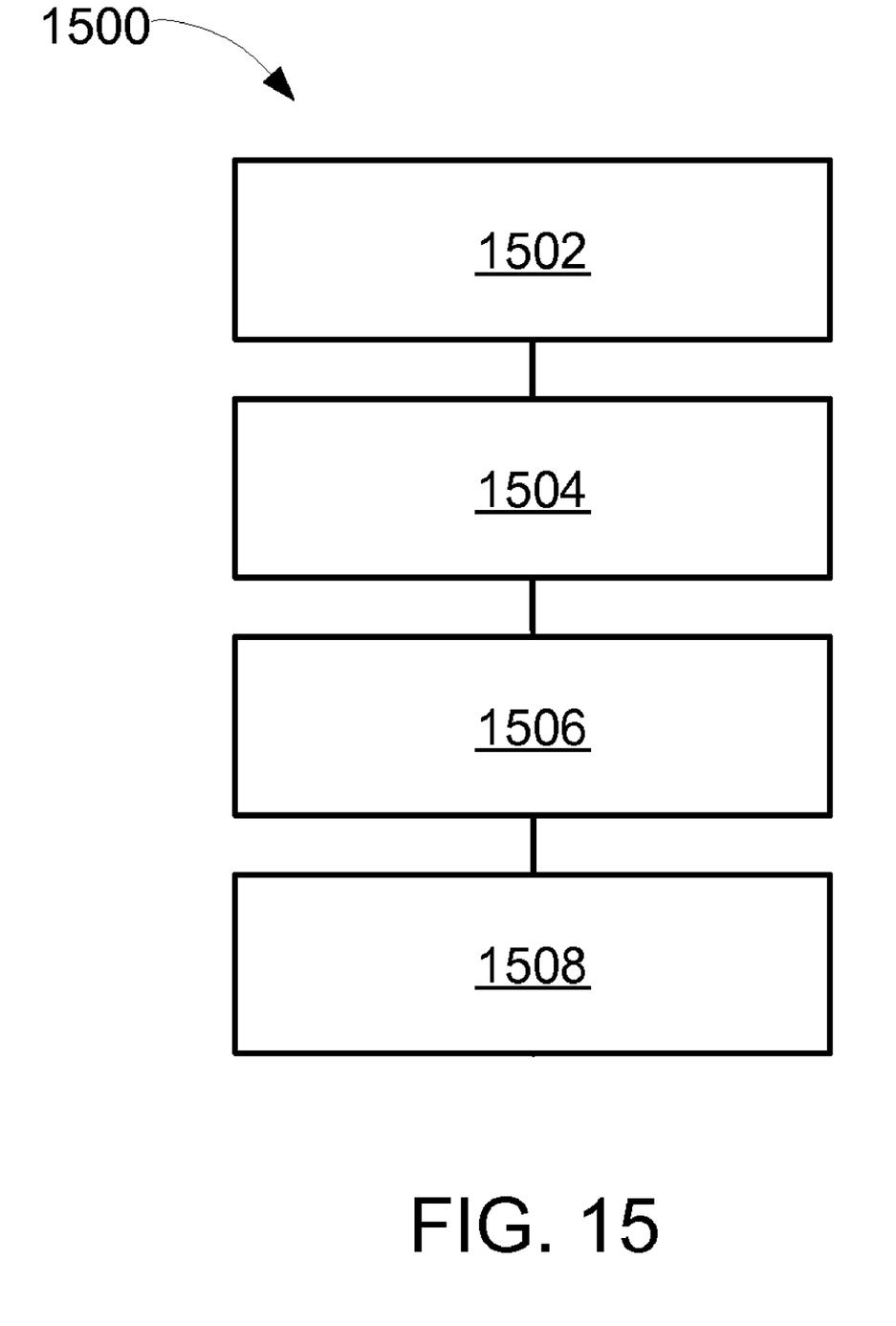
FIG. 15 is a flow chart for an integrated circuit package system for fabricating the integrated circuit package system in accordance with an embodiment of the present invention.

Referring now to FIG. 15, therein is shown a flow chart for an integrated circuit package system 1500 for fabricating the integrated circuit package system 100, 900, 1100 or 1300 in accordance with an embodiment of the present invention. The integrated circuit package system 1500 includes providing a leadframe in a block 1502; forming an aperture within the leadframe in a block 1504; mounting a known good package to the leadframe over or under the aperture in a block 1506; and mounting a die within the aperture to the known good package in a block 1508.

It has been discovered that the present invention thus has numerous advantages. A principle advantage is that the present invention may incorporate multiple IC components that are each tested independently prior to final assembly. By incorporating known good die IC components, the overall assembly process yield performance may be improved and the cost of production may be decreased.

Another advantage is that the vertical stacking of multiple IC components into the same package can increase circuit density without employing additional valuable space on the mounting substrate.

A further advantage is component modularization. The present invention may incorporate various modular components to create numerous mixed function devices. By employing standard IC components the cost of production may be reduced.

These and other valuable aspects of the present invention consequently further the state of the technology to at least the next level.

Thus, it has been discovered that the integrated circuit package system of the present invention furnishes important and heretofore unknown and unavailable solutions, capabilities, and functional advantages. For instance, by providing a process that incorporates known good die IC components, vertical stacking of IC components, and IC component modularization, a more cost efficient and higher yield product can be produced. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. An integrated circuit package system comprising:
providing a dual row leadframe;
forming an aperture within the leadframe;
mounting an integrated circuit package to the leadframe over or under the aperture; and
mounting a die over the integrated circuit package, the die located within the aperture.

2. The system as claimed in claim 1 wherein:
mounting the integrated circuit package includes mounting wire bond packages, flip-chip packages, or stacked die packages.

3. The system as claimed in claim 1 wherein:
mounting the integrated circuit package includes mounting quad-flat non-leaded packages, dual-side memory packages, or internal stacking module packages.

4. The system as claimed in claim 1 wherein:
mounting the die includes stacking wire bond die, flip chip die, stacked die or combinations thereof.

5. An integrated circuit package system comprising:
a dual row leadframe having an aperture provided therein;
an integrated circuit package mounted to the leadframe over or under the aperture; and
a die mounted over the integrated circuit package, the die located within the aperture.

6. The system as claimed in claim 5 wherein:
the integrated circuit package includes wire bond packages, flip-chip packages, or stacked die packages.

7. The system as claimed in claim 5 wherein:
the integrated circuit package includes quad-flat non-leaded packages, dual-side memory packages, or internal stacking module packages.

8. The system as claimed in claim 5 wherein:
the die includes wire bond die, flip chip die, stacked die or combinations thereof.

* * * * *